(12) United States Patent
Hong et al.

(10) Patent No.: US 12,021,166 B2
(45) Date of Patent: Jun. 25, 2024

(54) HIGH-VOLTAGE LIGHT-EMITTING DEVICE

(71) Applicant: XIAMEN SAN'AN OPTOELECTRONICS CO., LTD., Fujian Province (CN)

(72) Inventors: Ling-Yuan Hong, Fujian (CN); Qing Wang, Fujian (CN); Dazhong Chen, Fujian (CN); Quanyang Ma, Fujian (CN); Su-Hui Lin, Fujian (CN); Chung-Ying Chang, Fujian Province (CN)

(73) Assignee: XIAMEN SAN'AN OPTOELECTRONICS CO., LTD., Fujian Province (CN)

( * ) Notice: Subject to any disclaimer, the term of this patent is extended or adjusted under 35 U.S.C. 154(b) by 399 days.

(21) Appl. No.: 17/530,205

(22) Filed: Nov. 18, 2021

(65) Prior Publication Data
US 2022/0209048 A1    Jun. 30, 2022

(30) Foreign Application Priority Data
Dec. 29, 2020   (CN) .......................... 202011600585.2

(51) Int. Cl.
*H01L 33/44*    (2010.01)
*H01L 27/15*    (2006.01)
*H01L 33/08*    (2010.01)
*H01L 33/38*    (2010.01)
*H01L 33/42*    (2010.01)
*H01L 33/62*    (2010.01)

(52) U.S. Cl.
CPC ............ *H01L 33/08* (2013.01); *H01L 27/156* (2013.01); *H01L 33/44* (2013.01); *H01L 33/382* (2013.01); *H01L 33/42* (2013.01); *H01L 33/62* (2013.01)

(58) Field of Classification Search
CPC ....... H01L 33/08; H01L 27/156; H01L 33/44; H01L 33/382; H01L 33/42; H01L 33/62
See application file for complete search history.

(56) References Cited

U.S. PATENT DOCUMENTS

2012/0056212 A1* 3/2012 Huang .................. H01L 27/153
257/E33.056

* cited by examiner

*Primary Examiner* — Elias Ullah
(74) *Attorney, Agent, or Firm* — DLA PIPER LLP (US)

(57) ABSTRACT

A light-emitting device includes a substrate, multiple light-emitting units that are disposed on the substrate, that are spaced apart by an isolation trench and that are and electrically interconnected by an interconnecting structure, and an insulating layer with thickness of 200 nm to 450 nm. A potential difference between adjacent two light-emitting units not in direct electrical connection is at least two times forward voltage of each of the light-emitting units. Each light-emitting unit includes a light-emitting stack and a light-transmissible current spreading layer. The insulating layer covers the light-transmissible current spreading layers and at least a part of the light-emitting stacks.

20 Claims, 8 Drawing Sheets

HIGH-VOLTAGE LIGHT-EMITTING DEVICE

CROSS-REFERENCE TO RELATED APPLICATION

This application claims priority of Chinese Invention Patent Application No. 202011600585.2, filed on Dec. 29, 2020.

FIELD

The disclosure relates to a semiconductor device, and more particularly to a high-voltage light-emitting device.

BACKGROUND

Static electricity tends to build up in a light-emitting device containing a p-n junction during the manufacturing, selection, testing, packaging, transportation, installation, usage, etc. of the light-emitting device. If the static electricity in the light-emitting device is not timely released, the build-up static electricity might result in a voltage that is high enough to damage the light-emitting device. Specifically, the static electricity might be released from the light-emitting device within several nanoseconds, resulting in a temperature that could go up to 1400° C., which might burn through layers of the light-emitting device, thereby causing current leakage and/or short circuit to the light-emitting device. Therefore, the ability of withstanding electrostatic discharge (ESD) is one of the important aspects of testing the light-emitting device, and may be used for predicting the possibility of electrostatic damage (including burn through, burn mark, etc.) to the light-emitting device.

A high-voltage light-emitting device includes multiple light-emitting cells that are connected in series by metal wiring, and has high operation voltage and low current. In practical use, the high-voltage light-emitting device has a relatively weak ability of withstanding ESD. Therefore, electrostatic damage might occur during various stages of testing and/or use of the high-voltage light-emitting device.

SUMMARY

According to an aspect of this disclosure, a light-emitting device includes a substrate, a plurality of light-emitting units, an interconnect structure and an insulating layer. The light-emitting units are disposed on the substrate, and are spaced apart from each other by an isolation trench. Two of the light-emitting units are adjacent to each other but not in direct electrical connection with each other. A potential difference between the two of the light-emitting units is at least two times a forward voltage of each of the two of the light-emitting units. Each of the light-emitting units includes a light-emitting stack, and a light-transmissible current spreading layer that covers at least a part of the light-emitting stack. The interconnect structure electrically interconnects the light-emitting units. The insulating layer covers the light-transmissible current spreading layers of the light-emitting units and at least a part of the light-emitting stacks of the light-emitting units, and has a thickness ranging from 200 nm to 450 nm.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
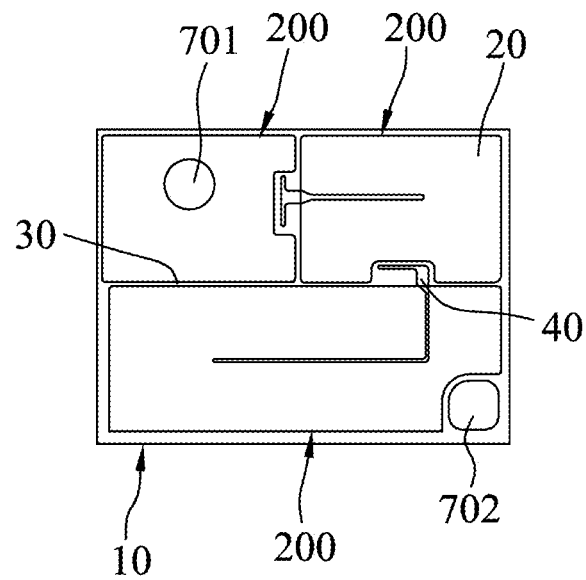
FIGS. 1 to 4 show various arrangements of light-emitting units of light-emitting devices in accordance with some embodiments of this disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, in accordance with some embodiments of this disclosure, a light-emitting device includes a substrate 10, a plurality of light-emitting units 200 (three are schematically shown in FIG. 1, but the number of the light-emitting units 200 may be changed according to practical requirements) that are disposed on the substrate 10 and that are spaced apart from each other by an isolation trench 30, and an interconnect structure 40 that extends across the isolation trench 30 and that connects the light-emitting units 200 in series. In some embodiments, the substrate 10 may be made of sapphire, aluminum nitride, or other suitable insulating materials. As shown in FIG. 1, the three light-emitting units 200 are arranged in two rows, where two of the light-emitting units 200 are in the first row and the remaining one of the light-emitting units 200 is in the second row. The light-emitting units 200 in the first row are electrically connected with each other, and the light-emitting unit 200 in the second row is electrically connected to the last one of the light-emitting unit 200 in the first row. The first one of the light-emitting units 200 in the first row is physically adjacent to the light-emitting unit 200 in the second row but is not in direct electrical connection with the light-emitting unit 200 in the second row. A potential difference between the first one of the light-emitting units 200 in the first row and the light-emitting unit 200 in the second row is two times a forward voltage of each of the light-emitting units 200.

Figure 2:
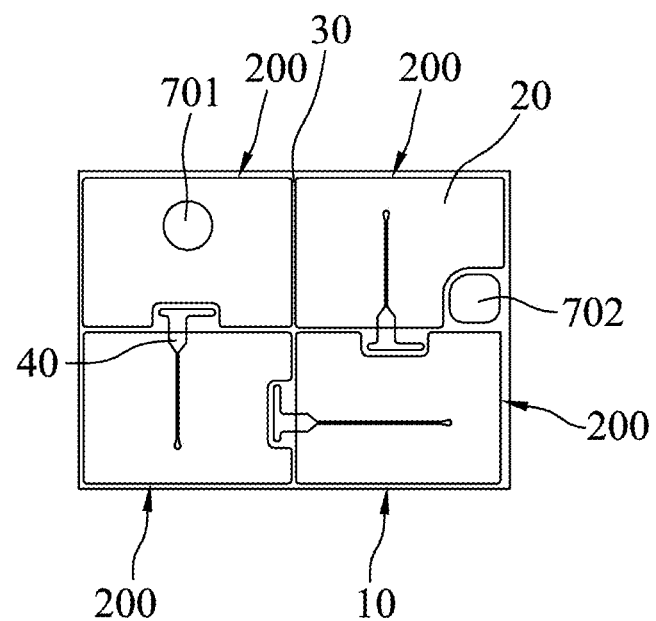

Referring to FIG. 2, in some embodiments, the light-emitting device includes four of the light-emitting units 200 that are arranged in two columns, where two of the light-emitting units 200 are disposed in the first column and the remaining two of the light-emitting units 200 are disposed in the second column. That is, the light-emitting units 200 are arranged in a two-by-two matrix. The light-emitting units 200 in the first column are electrically connected with each other, and the light-emitting units 200 in the second column are electrically connected with each other. One of the light-emitting units 200 in the first column is electrically connected with one of the light-emitting units 200 that is in the second column and that is adjacent to the one of the light-emitting units 200 in the first column. As a result, the first one of the light-emitting units 200 in the first column is physically adjacent to the first one of the light-emitting units 200 in the second column but is not in direct electrical connection with the first one of the light-emitting units 200 in the second column. A potential difference between the first one of the light-emitting units 200 in the first column and the first one of the light-emitting units 200 in the second column is three times the forward voltage of each of the light-emitting units 200.

Figure 3:
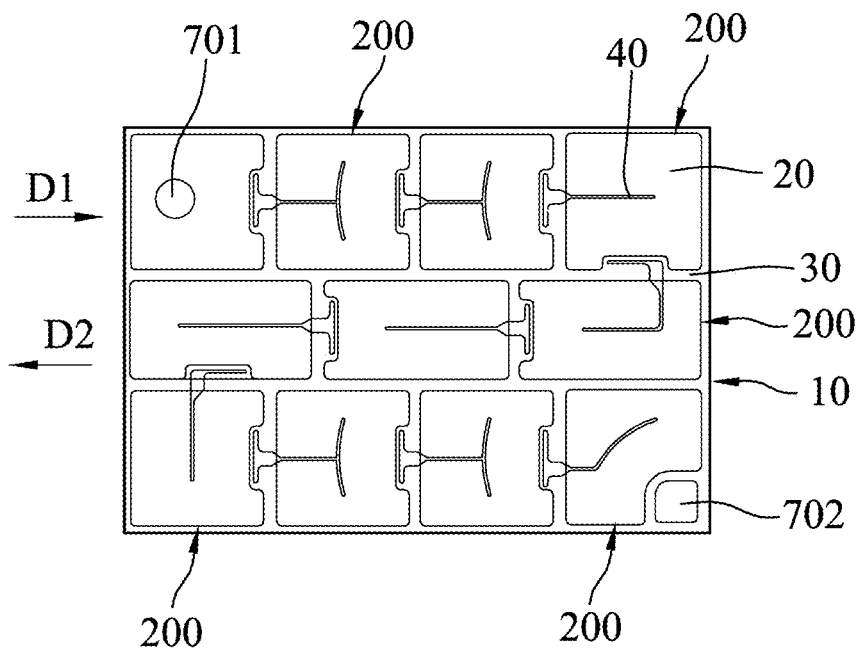

Referring to FIG. 3, in some embodiments, the light-emitting device includes eleven of the light-emitting units 200 that are arranged in three rows, where four of the light-emitting units 200 are disposed in the first row which extends in a first direction (D1), three of the light-emitting units 200 are disposed in the second row which extends in a second direction (D2) opposite to the first direction (D1), and the remaining four of the light-emitting units 200 are disposed in the third row which extends in the first direction (D1). In some embodiments, the four light-emitting units 200 in the first row are electrically connected with each other in series, the three light-emitting units 200 in the second row are electrically connected with each other in series, and the four light-emitting units 200 in the third row are electrically connected with each other in series. In some embodiments, the fourth one of the light-emitting units 200 in the first row along the first direction (D1) is electrically connected to the first one of the light-emitting units 200 in the second row along the second direction (D2) that is closest to the fourth one of the light-emitting units 200, and the third one of the light-emitting units 200 in the second row along the second direction (D2) is electrically connected to the first one of the light-emitting units 200 in the third row along the first direction (D1) that is closest to the third one of the light-emitting units 200. Therefore, all of the eleven light-emitting units 200 are connected in series. The first one of the light-emitting units 200 in the first row is physically adjacent to the third one of the light-emitting units 200 in the second row, and a potential difference between the first one of the light-emitting units 200 in the first row and the third one of the light-emitting units 200 in the second row is six times the forward voltage of each of the light-emitting units 200. The first one of the light-emitting units 200 in the second row is physically adjacent to the fourth one of the light-emitting units 200 in the third row, and a potential difference between the first one of the light-emitting units 200 in the second row and the fourth one of the light-emitting units 200 in the third row is six times the forward voltage of each of the light-emitting units 200.

Figure 4:
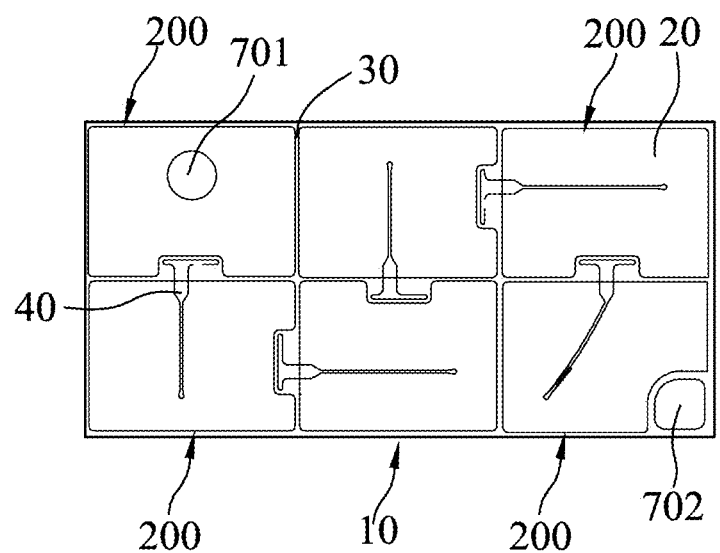

Referring to FIG. 4, in some embodiments, the light-emitting device includes six of the light-emitting units 200 that are arranged in two rows and three columns and that are connected in series. The light-emitting units 200 in the first column are connected with each other, the light-emitting units 200 in the second column are connected with each other, and the light-emitting units 200 in the third column are connected with each other. One of the light-emitting units 200 in the first column is connected to one of the light-emitting units 200 in the second column that is closest to the one of the light-emitting units 200 in the first column, and one of the light-emitting units 200 in the third column is connected to the other one of the light-emitting units 200 in the second column that is closest to the one of the light-emitting units 200 in the third column. The potential difference between the light-emitting units 200 closest to each other but not in direct electrical connection (e.g., the first light-emitting unit 200 in the first column and the first light-emitting unit 200 in the second column) is three times the forward voltage of each of the two of the light-emitting units 200.

It should be noted that the number and arrangement of the light-emitting units 200 should not be limited to those of the embodiments disclosed above, and can be changed according to practical requirements. For example, in some embodiments, the light-emitting device includes eight of the light-emitting units 200 that are arranged in three rows, where three of the light-emitting units 200 are in the first row, four of the light-emitting units 200 are in the second row, and the remaining three of the light-emitting units 200 are in the third row. The light-emitting units 200 are connected in series, with two of the light-emitting units 200 being adjacent to (e.g., closest to) each other but not in direct electrical connection with each other. A potential difference between such adjacent two light-emitting units 200 are at least two times the forward voltage of each of the light-emitting units 200.

Figure 5:
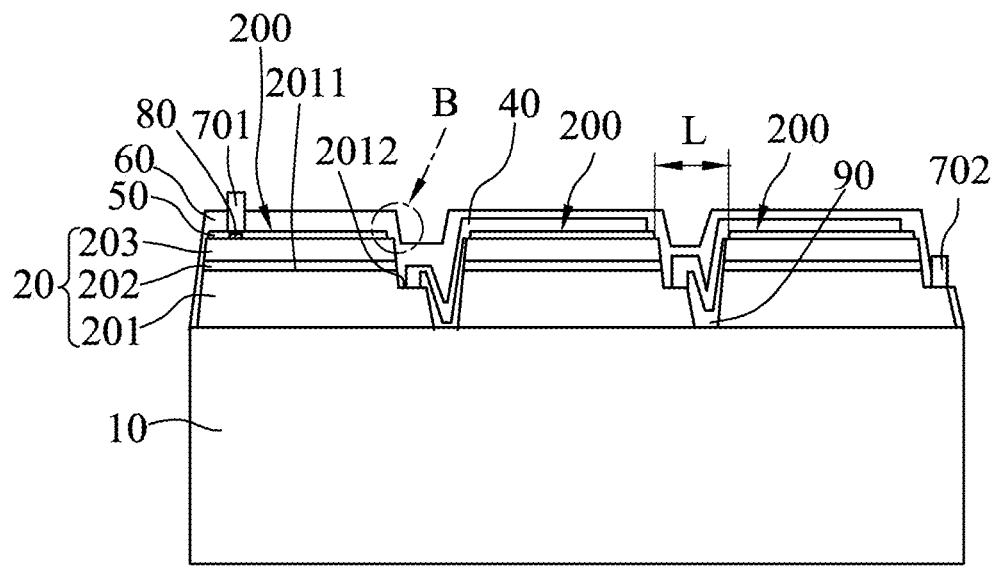
FIGS. 5 to 7 show various schematic sectional views of light-emitting devices in accordance with some embodiments of this disclosure.

With the continuous development of light-emitting devices, the light-emitting units are made to be smaller and located closer to each other, exacerbating ESD problems. Therefore, it is increasingly important to improve the light-emitting devices' ability to withstand ESD. FIG. 5 is a schematic sectional view showing the light-emitting device including three light-emitting units 200 that are disposed on the substrate 10. Each of the light-emitting units 200 includes a light-emitting stack 20, and a light-transmissible current spreading layer 50 that covers at least a part of the light-emitting stack 20. The light-emitting stack 20 of each of the light-emitting units 200 includes a first-type semiconductor layer 201 that includes an upper mesa 2011 and a lower mesa 2012, an active layer 202 that is disposed on the upper mesa 2011, and a second-type semiconductor layer 203 that is disposed on the active layer 202, where the lower mesa 2012 is exposed from the active layer 202 and the second-type semiconductor layer 203. In some embodiments, the second-type semiconductor layer 203 of each of the light-emitting units 200 is at least partially covered by the light-transmissible current spreading layer 50 of the light-emitting unit 200. In some embodiments, the first-type semiconductor layer 201 of each of the light-emitting units 200 may be directly connected to the substrate 10; and in other embodiments, a buffer layer (not shown) may be provided between the substrate 10 and the first-type semiconductor layer 201. The light-transmissible current spreading layer 50 of each of the light-emitting units 200 achieves current spreading purpose, and may be made of indium tin oxide (ITO), fluorine-doped tin oxide (FTO), graphene, any combination thereof, or other suitable materials. In some embodiments, the light-emitting device further includes a first electrode 702 that is disposed on and connected to the lower mesa 2012 of the first-type semiconductor layer 201 of one of the light-emitting units 200 (e.g., the light-emitting unit 200 on the right side of FIG. 5), and a second electrode 701 that is disposed on and connected to the light-transmissible current spreading layer 50 of one of the light-emitting units 200 (e.g., the light-emitting unit 200 on the left side of FIG. 5). In some embodiments, the light-emitting device may further include a current blocking layer 80 (see FIG. 5) that is disposed in the light-transmissible current spreading layer 50 of one of the light-emitting units 200 and that is located between the second electrode 701 and the second-type semiconductor layer 203 of the light-emitting unit 20 for preventing current from being directly injected into the second-type semiconductor layer 203, and therefore improving distribution of current. The light-transmissible current spreading layer 50 of each of the light-emitting units 200 may entirely cover or partially cover an upper surface of the second-type semiconductor layer 203 of the light-emitting unit 200. In some embodiments, the first-type semiconductor layer 201 of each of the light-emitting units 200 may be N-type, the second-type semiconductor layer 203 of each of the light-emitting units 200 may be P-typed, the first electrode 702 may be a N-electrode, and the second electrode 701 may be a P-electrode. In some embodiments, the first-type semiconductor layer 201 of each of the light-emitting units 200 may be P-type, the second-type semiconductor layer 203 of each of the light-emitting units 200 may be N-typed, the first electrode 702 may be a P-electrode, and the second electrode 701 may be a N-electrode. In some embodiments, the light-emitting device further includes an insulating layer 60 that covers the light-transmissible current spreading layers 50 of the light-emitting units 200, at least a part of the light-emitting stacks 20 of the light-emitting units 200, and the interconnect structure 40. In some embodiments, as shown in FIG. 4, the interconnect structure 40 is made of ITO or other suitable light-transmissible materials, and covers a substantial portion of the light-transmissible current spreading layer 50 of a corresponding one of the light-emitting units 200. In some embodiments, the light-emitting device may further include an electrical-insulating member 90 that is disposed under the interconnect structure 40. The first and second electrodes 702, 701 are exposed from the insulating layer 60.

Figure 8:
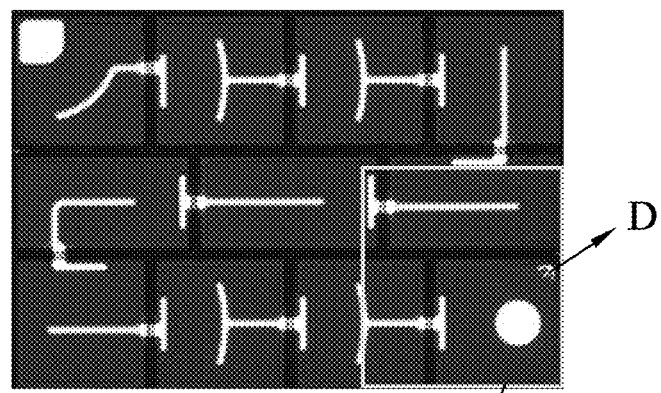
FIGS. 8 and 9 schematically show sites with electrostatic damage in the light-emitting devices.
Figure 9:
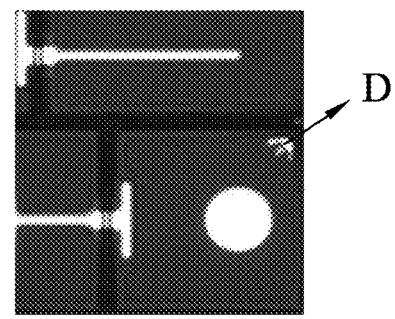

The electrostatic damage is believed to occur at the active layer 202 of light-emitting device. However, the electrostatic damage may also occur at a portion of the insulating layer 60 close to the corner of the light-transmissible current spreading layer 50, such as at position (D) shown in FIGS. 8 and 9 (FIG. 9 being an enlarged view taken from area (A) in FIG. 8). When the light-emitting units 200 are arranged in multiple columns and/or rows, adjacent two of the light-emitting units 200 (e.g., the light-emitting units 200', 200" in FIG. 8) are not in direct electrical connection, and a potential difference exists between the light-emitting units 200', 200" (i.e., there is a high electric field between the light-emitting units 200', 200"). Therefore, electric discharge may happen at corners of the light-transmissible current spreading layer 50 and/or the insulating layer 60 (e.g., at the sharp corner 601 shown in FIGS. 10 and 11) under a strong electric field, resulting in electrostatic damage if the insulating layer 60 is not thick enough.

Referring to FIG. 5, the insulating layer 60 may be used for protecting the light-emitting units 200, and prevents reverse leakage. The insulating layer 60 may be made of silicon oxide, silicon nitride, aluminum oxide, any combination thereof, or other suitable materials. Conventionally, the thickness of insulating layers is often not too thick (e.g., in the range of 80 nm to 100 nm) so as to avoid adversely affecting light-emitting efficiency of the light-emitting devices. However, such thickness (i.e., 80 nm to 100 nm) may not be enough for preventing ESD issues of the light-emitting devices. In accordance with some embodiments of this disclosure, the insulating layer 60 may have a thickness ranging from 200 nm to 450 nm for alleviating the ESD issues in one light-emitting unit 200 due to its proximity to another light-emitting unit 200. The difference in the light-emitting efficiency between the light-emitting device of this disclosure that includes the insulating layer 60 having a thickness of 200 nm to 450 nm and a conventional light-emitting device that includes an insulating layer having a thickness of 80 nm to 100 nm is within 0.5%. Therefore, the insulating layer 60 does not have a significant influence on the light-emitting efficiency of the light-emitting device. In some embodiments, the thickness of the insulating layer 60 may range from 200 nm to 300 nm. In some embodiments, the thickness of the insulating layer 60 may range from 230 nm to 300 nm. In some embodiments, the thickness of the insulating layer 60 may range from 250 nm to 300 nm.

The closer the light-transmissible current spreading layers 50 of two light-emitting units 200 (especially two light-emitting units 200 that are not in direct electrical connection), the stronger the electric field, and the more likely that electrostatic damage may occur. However, increasing the distance between two light-emitting units 200 is in contradiction with the current trend of device miniaturization, and also increases the possibility of chip breakage during manufacturing, leading to increased production time and cost. Therefore, referring to FIG. 5, in accordance with some embodiments of this disclosure, a distance (L) between the light-transmissible current spreading layers 50 of two of the adjacent light-emitting units 200, which may or may not be in direct electrical connection with each other, ranges from 20 μm to 100 μm. If the distance (L) is greater than 100 μm, the overall dimension of the light-emitting device may be increased. If the distance (L) is less than 20 μm, electrostatic damage is more likely to occur in the light-emitting device. In some embodiments, the distance (L) may range from 20 μm to 50 μm. In some embodiments, the distance (L) may range from 50 μm to 100 μm.

Figure 6:
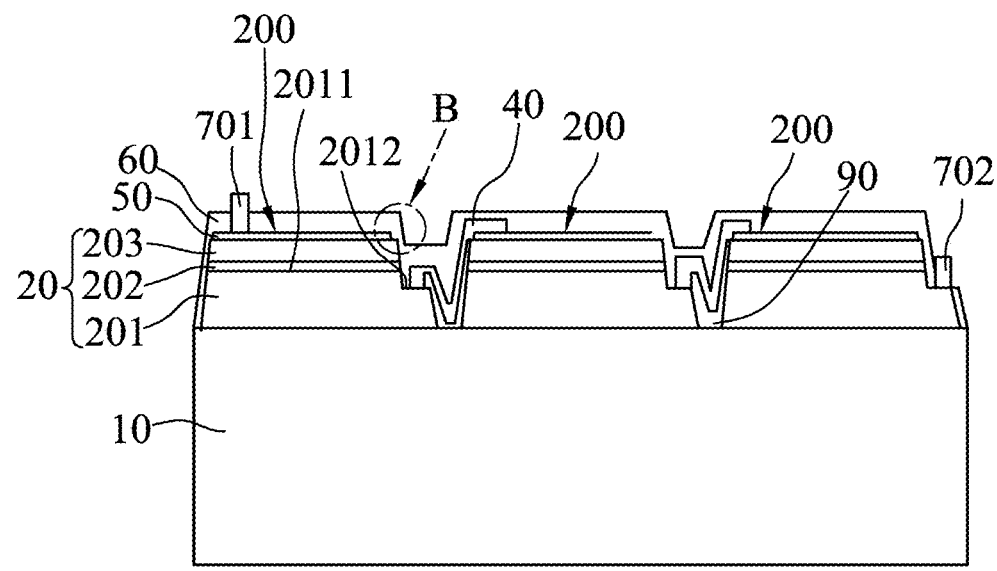

Referring to FIG. 6, in some embodiments, the interconnect structure 40 may be made of a conductive material that is less light-transmissible, such as metal. Therefore, the interconnect structure 40 only covers a portion of the light-transmissible current spreading layer 50 of the corresponding one of the light-emitting units 200 so as not to block emission of light from the light-emitting unit 200.

Figure 7:
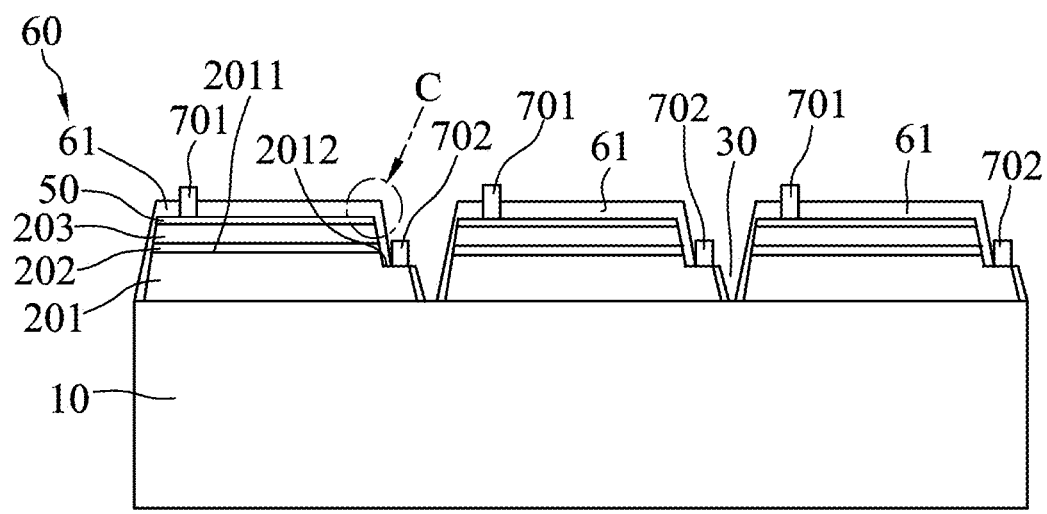

Referring to FIG. 7, in some embodiments, the light-transmissible current spreading layer 50 of each of the light-emitting units 200 may cover the upper surface of the second-type semiconductor layer 203 of the light-emitting unit 200. The insulating layer 60 may include a plurality of insulating sub-layers 61 that respectively cover the light-emitting units 200. The light-emitting device may include a plurality of the first electrodes 702 that are respectively disposed on and connected to the lower mesas 2012 of the first-type semiconductor layers 201 of the light-emitting units 200, and a plurality of second electrodes 701 that are respectively disposed on and connected to the light-transmissible current spreading layers 50 of the light-emitting units 200.

Figure 10:
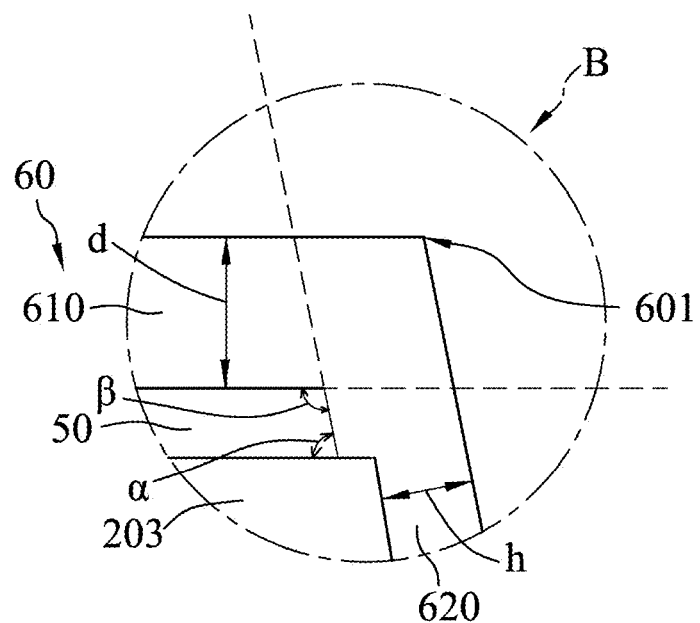
FIGS. 10 and 11 are enlarged views respectively taken from circles (B) in FIGS. 5, 6 and circle (C) in FIG. 7.
Figure 11:
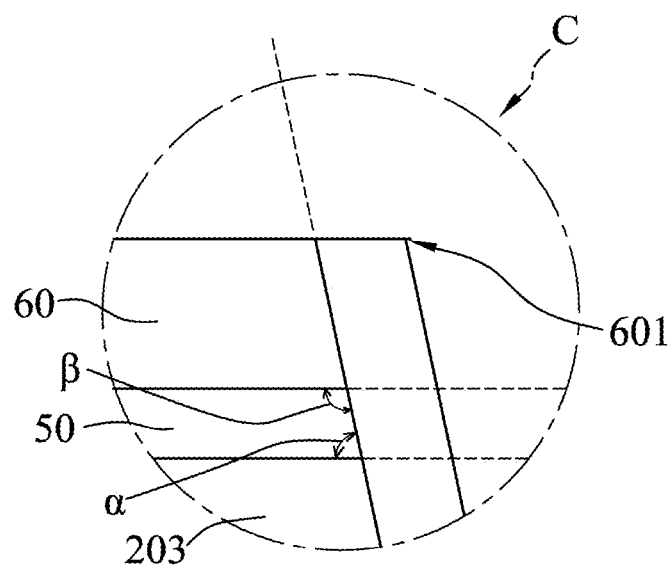
Figure 12:
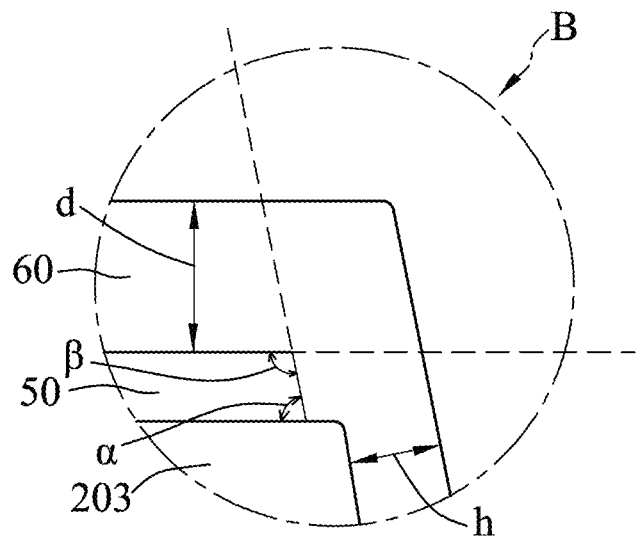
FIG. 12 is a variation of the view shown in FIG. 10.

FIGS. 10 and 11 are enlarged views respectively taken from circles (B) in FIGS. 5, 6 and circle (C) in FIG. 7. In some embodiments, for each of the light-emitting units 200, a first portion 610 of the insulating layer 60 disposed on an upper surface of the light-transmissible current spreading layer 50 has a thickness (d) measured in a direction perpendicular to the upper surface of the light-transmissible current spreading layer 50, a second portion 620 of the insulating layer 60 disposed on a side surface of the light-transmissible current spreading layer 50 has a thickness (h) measured in a direction perpendicular to the side surface of the light-transmissible current spreading layer 50, and $0.8 \leq h/d \leq 1$ so that the electrostatic damage is less likely to happen. In some embodiments, for each of the light-emitting units 200, an included angle (α) between a bottom surface of the light-transmissible current spreading layer 50 connected to the second-type semiconductor layer 203 and a side surface of the light-transmissible current spreading layer 50 may range from 10° to 45°. In some embodiments, for each of the light-emitting units 200, an included angle (β) between an upper surface of the light-transmissible current spreading layer 50 and the side surface of the light-transmissible current spreading layer 50 may range from 135° to 170°. Referring to FIG. 12, in some embodiments, for each of the light-emitting units 200, an upper surface of the insulating layer 60 may be connected to a side surface of the insulating layer 60 to form a smooth surface, and the upper surface of the light-transmissible current spreading layer 50 may be connected to the side surface of the light-transmissible current spreading layer 50 to form a smooth surface so as to further reduce the possibility of electrostatic damage.

Figure 13:
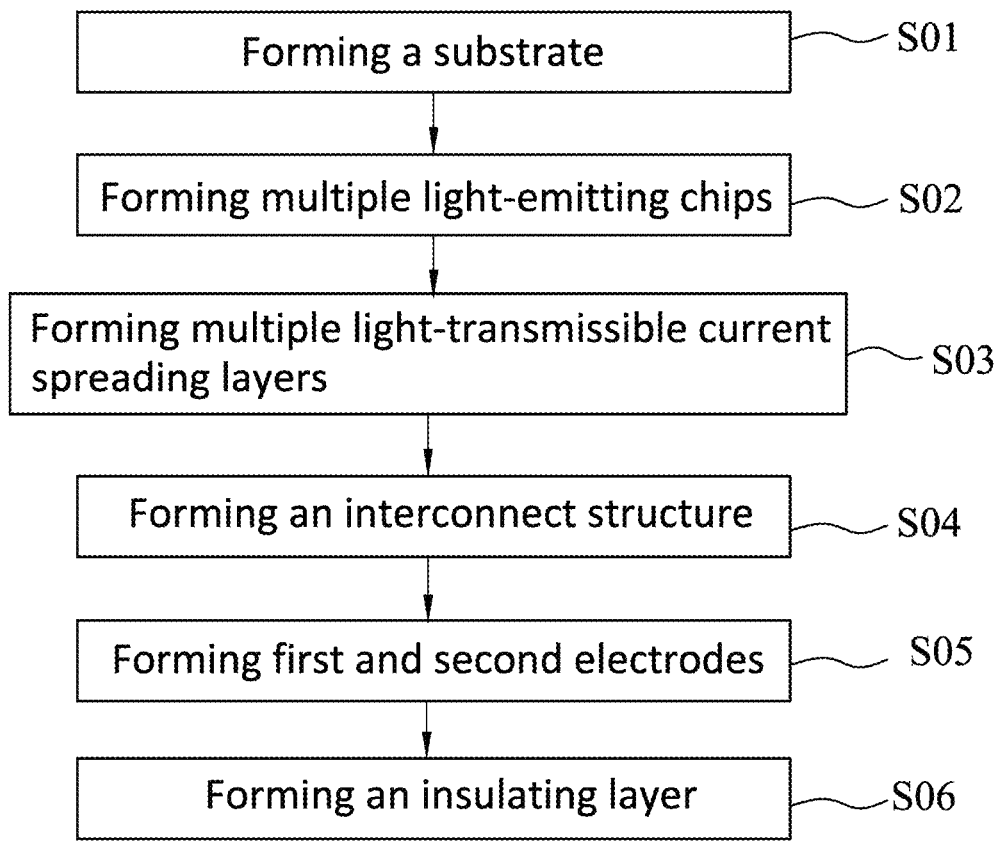
FIG. 13 is a flow chart of a method for making the light-emitting device in accordance with some embodiments of this disclosure.

Referring to FIG. 13, a method for making the light-emitting device in accordance with some embodiments of this disclosure at least includes steps S01 to S06.

Figure 14:
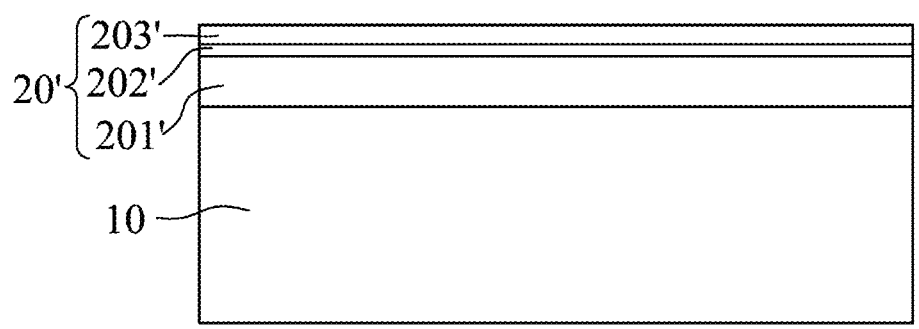
FIGS. 14 to 19 show various steps of the method.
Figure 15:
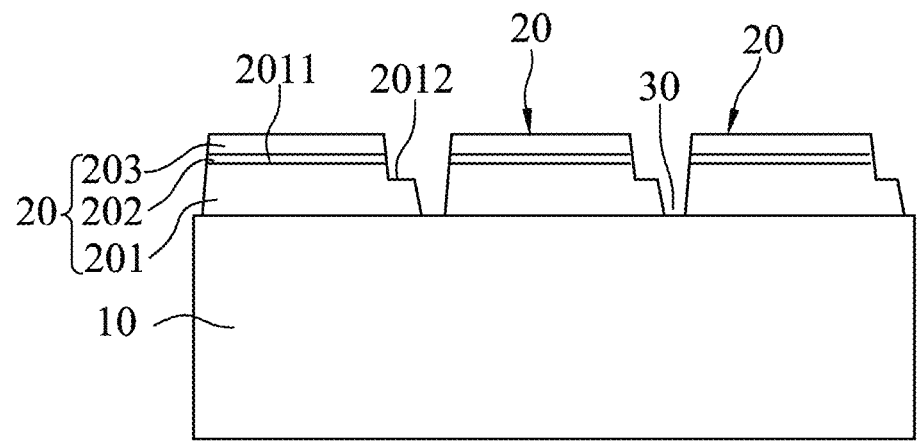

In step S01, the substrate 10 is formed. Then, the method proceeds to step S02, where a light-emitting stack layer 20' (see FIG. 14) is formed, which includes a first-type semiconductor film 201', an active film 202' and a second-type semiconductor film 203'. The light-emitting stack layer 20' may be formed by metal-organic chemical vapor deposition (MOCVD) or other suitable techniques. Afterwards, referring to FIGS. 14 and 15, the light-emitting stack layer 20' is etched to form a plurality of the light-emitting stacks 20 that are separated from each other by the isolation trench 30. Each of the light-emitting stacks 20 includes the first-type semiconductor layer 201, the active layer 202 and the second-type semiconductor layer 203. The light-emitting stack layer 20' may be etched by dry and/or wet etching techniques.

Figure 16:
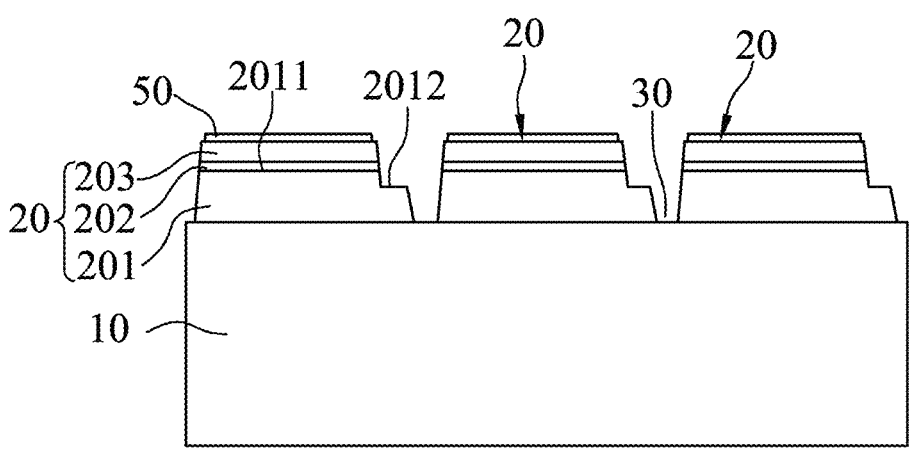

Then, referring to FIGS. 13 and 16, the method proceeds to step S03, where a plurality of the light-transmissible current spreading layers 50 are respectively formed on the second-type semiconductor layers 203 of the light-emitting stacks 20, thereby obtaining a plurality of the light-emitting units 200, each of which includes the light-emitting stack 20 and the light-transmissible current spreading layer 50. In some embodiments, as shown in FIG. 5, the current blocking layer 80 may be formed in one of the light-transmissible current spreading layers 50.

Figure 17:
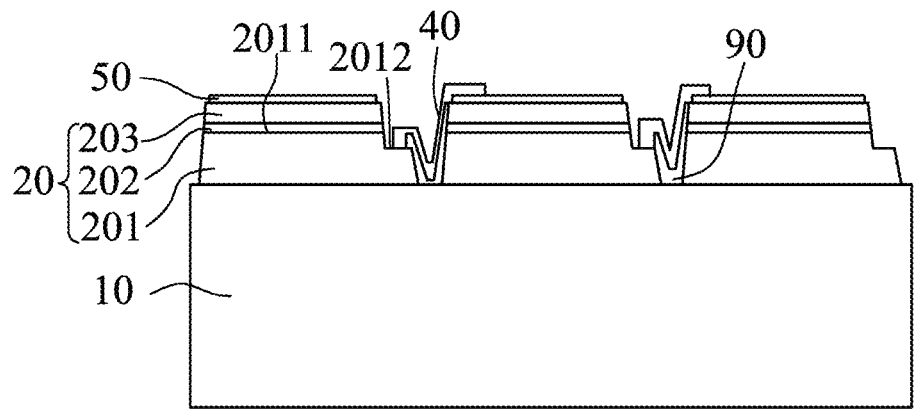

Then, referring to FIGS. 13 and 17, the method proceeds to step S04, where the interconnect structure 40 is formed. In some embodiments, before forming the interconnect structure 40, the electrical-insulating member 90 may be formed.

Figure 18:
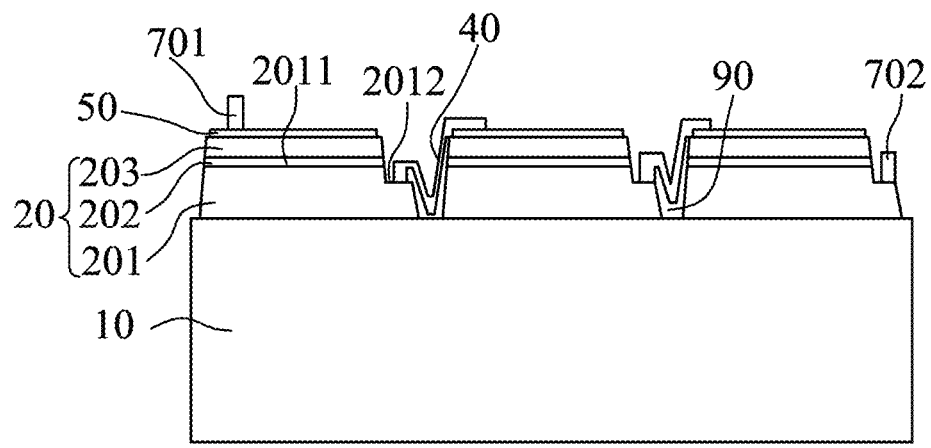

Then, referring to FIGS. 13 and 18, the method proceeds to step S05, where the first and second electrodes 702, 701 are formed.

Figure 19:
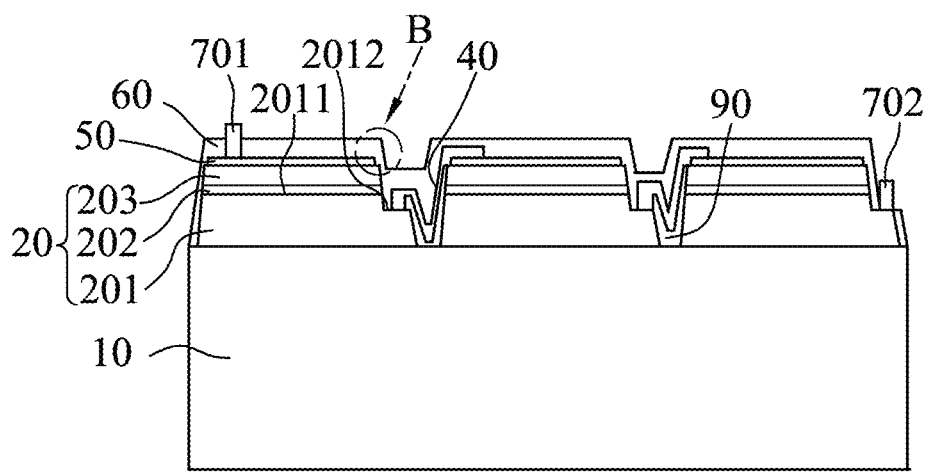

Then, referring to FIGS. 13 and 19, the method proceeds to step S06, where the insulating layer 60 is formed, thereby obtaining the light-emitting device in accordance with some embodiments of this disclosure.

It should be noted that each of the steps of the method may be changed according to practical requirements in order to make the light-emitting device shown in FIGS. 1 to 7 and 10 to 12, or any other embodiments of this disclosure.

In an experimental example, the light-emitting devices having the configurations shown in FIGS. 3 and 4 which include the insulating layer 60 with different thickness are tested. The forward voltage (VF4) of each sample is measured with 1 μA of current applied to the sample, and a 2000 V voltage (ESD testing voltage) is then applied to the sample. Then, the forward voltage of the sample is measured again. If the difference of forward voltages (ΔVF4) of the sample before and after the application of the ESD testing voltage is not greater than 0.5 V (i.e., −0.5V≤ΔVF4≤0.5V), the sample is deemed to pass the ESD testing. The test results are illustrated in Table 1 below.

TABLE 1

| | Thickness of Insulating Layer (nm) | Sample Number | Number of Samples Passing ESD Testing | Pass Rate |
|---|---|---|---|---|
| Comparative Example with configurations shown in FIG. 3 | 80 | 210 | 32 | 15.7% |
| Sample 1 with configurations shown in FIG. 3 | 200 | 210 | 197 | 93.8% |
| Sample 2 with configurations shown in FIG. 3 | 230 | 210 | 201 | 95.7% |
| Sample 3 with configurations shown in FIG. 3 | 250 | 210 | 207 | 98.6% |
| Sample 4 with configurations shown in FIG. 3 | 290 | 210 | 208 | 99.0% |
| Sample 5 with configurations shown in FIG. 3 | 300 | 210 | 209 | 99.5% |
| Sample 6 with configurations shown in FIG. 3 | 450 | 210 | 209 | 99.5% |
| Comparative Example with configurations shown in FIG. 4 | 80 | 210 | 30 | 14.3% |
| Sample 1 with configurations shown in FIG. 4 | 200 | 210 | 196 | 93.3% |
| Sample 2 with configurations shown in FIG. 4 | 230 | 210 | 202 | 96.1% |
| Sample 3 with configurations shown in FIG. 4 | 250 | 210 | 204 | 97.1% |
| Sample 4 with configurations shown in FIG. 4 | 290 | 210 | 205 | 97.6% |
| Sample 5 with configurations shown in FIG. 4 | 300 | 210 | 207 | 98.6% |
| Sample 6 with configurations shown in FIG. 4 | 450 | 210 | 209 | 99.5% |

As shown in Table 1, for samples with configuration as shown in FIG. 3, if the thickness of the insulating layer 60 is increased from 80 nm to at least 200 nm (up to 450 nm), the pass rate is increased from 15.7% to at least 93.8% (up to 99.5%), and the pass rate is increased from 14.3% to at least 93.3% (up to 99.5%) for samples with configuration as shown in FIG. 4. Therefore, it is demonstrated that the insulating layer 60 with a thickness ranging from 200 nm to 450 nm can effectively improve the ability of the light-emitting device to pass ESD testing.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment but is intended to cover various arrangements included within the spirit and scope of the broadest interpretation so as to encompass all such modifications and equivalent arrangements.

What is claimed is:

1. A light-emitting device comprising:
   a substrate;
   a plurality of light-emitting units that are disposed on said substrate and that are spaced apart from each other by an isolation trench, two of said light-emitting units being adjacent to each other but not in direct electrical connection with each other, a potential difference between said two of said light-emitting units being at least two times a forward voltage of each of said two of said light-emitting units, each of said light-emitting units including a light-emitting stack, and a light-transmissible current spreading layer that covers at least a part of said light-emitting stack;
   an interconnect structure that electrically interconnects said light-emitting units; and
   an insulating layer that covers said light-transmissible current spreading layers of said light-emitting units and at least a part of said light-emitting stacks of said light-emitting units, and that has a thickness ranging from 200 nm to 450 nm.

2. The light-emitting device as claimed in claim 1, wherein said light-emitting units are arranged in at least two rows and at least two columns, and the potential difference between said two of said light-emitting units is at least three times the forward voltage of each of said light-emitting units.

3. The light-emitting device as claimed in claim 1, wherein:
   said light-emitting stack of each of said light-emitting units includes a first-type semiconductor layer that includes an upper mesa and a lower mesa, an active layer that is disposed on said upper mesa, and a second-type semiconductor layer that is disposed on said active layer; and
   said light-transmissible current spreading layer at least partially covers said second-type semiconductor layer.

4. The light-emitting device as claimed in claim 3, further comprising a first electrode that is disposed on and connected to said lower mesa of said first-type semiconductor layer of one of said light-emitting units, and a second electrode that is disposed on and connected to said light-transmissible current spreading layer of one of said light-emitting units.

5. The light-emitting device as claimed in claim 3, wherein said light-transmissible current spreading layer of each of said light-emitting units covers an upper surface of said second-type semiconductor layer.

6. The light-emitting device as claimed in claim 3, wherein said light-transmissible current spreading layer of each of said light-emitting units partially covers an upper surface of said second-type semiconductor layer.

7. The light-emitting device as claimed in claim 4, wherein said first-type semiconductor layer of each of said light-emitting units is N-typed, said second-type semiconductor layer of each of said light-emitting units is P-typed, said first electrode is an N-electrode, and said second electrode is a P-electrode.

8. The light-emitting device as claimed in claim 4, wherein said first-type semiconductor layer of each of said light-emitting units is P-typed, said second-type semiconductor layer of each of said light-emitting units is N-typed, said first electrode is a P-electrode, and said second electrode is an N-electrode.

9. The light-emitting device as claimed in claim 1, wherein the thickness of said insulating layer ranges from 200 nm to 300 nm.

10. The light-emitting device as claimed in claim 9, wherein the thickness of said insulating layer ranges from 230 nm to 300 nm.

11. The light-emitting device as claimed in claim 1, wherein a distance between said light-transmissible current spreading layers of said two of said adjacent light-emitting units ranges from 20 µm to 100 µm.

12. The light-emitting device as claimed in claim 11, wherein the distance between said light-transmissible current spreading layers of said two of said adjacent light-emitting units ranges from 20 µm to 50 µm.

13. The light-emitting device as claimed in claim 11, wherein the distance between said light-transmissible current spreading layers of said two of said adjacent light-emitting units ranges from 50 µm to 100 µm.

14. The light-emitting device as claimed in claim 1, wherein, for each of said light-emitting units, a first portion of said insulating layer disposed on an upper surface of said light-transmissible current spreading layer has a thickness (d), a second portion of said insulating layer disposed on a side surface of said light-transmissible current spreading layer has a thickness (h), and $0.8 \leq h/d \leq 1$.

15. The light-emitting device as claimed in claim 1, wherein, for each of said light-emitting units, an included angle between a bottom surface of said light-transmissible current spreading layer and a side surface of said light-transmissible current spreading layer ranges from 10° to 45°.

16. The light-emitting device as claimed in claim 1, wherein, for each of said light-emitting units, an upper surface of said insulating layer is connected to a side surface of said insulating layer to form a smooth surface, or an upper surface of said light-transmissible current spreading layer is connected to a side surface of said light-transmissible current spreading layer to form a smooth surface.

17. The light-emitting device as claimed in claim 1, wherein said light-emitting device comprises three of said light-emitting units that are disposed adjacent to each other and that are connected in series.

18. The light-emitting device as claimed in claim 1, wherein said light-emitting device comprises four of said light-emitting units that are arranged in a two-by-two matrix, and that are connected in series.

19. The light-emitting device as claimed in claim 1, wherein:
   said light-emitting device comprises six of said light-emitting units that are arranged in two rows and three columns and that are connected in series;
   said light-emitting units in the first column are connected with each other;
   said light-emitting units in the second column are connected with each other;
   said light-emitting units in the third column are connected with each other;

one of said light-emitting units in the first column is connected to one of said light-emitting units in the second column; and one of said light-emitting units in the third column is connected to the other one of said light-emitting units in the second column.

20. The light-emitting device as claimed in claim 1, wherein:

said light-emitting device comprises eleven of said light-emitting units that are arranged in three rows where four of said light-emitting units in the first row extend in a first direction, three of said light-emitting units in the second row extend in a second direction opposite to the first direction, and four of said light-emitting units in the third row extend in the first direction;

said light-emitting units in the first row are connected in series, and the fourth one of said light-emitting units in the first row along the first direction is connected to the first one of said light-emitting units in the second row along the second direction that is closest to the fourth one of said light-emitting units;

said light-emitting units in the second row are connected in series, and the third one of said light-emitting units in the second row along the second direction is connected to the first one of said light-emitting units in third row along the first direction; and said light-emitting units in the third row are connected in series.

\* \* \* \* \*